United States Patent [19]

Okamura et al.

[11] Patent Number: 5,521,126

[45] Date of Patent: May 28, 1996

[54] METHOD OF FABRICATING SEMICONDUCTOR DEVICES

[75] Inventors: Kenji Okamura; Masanobu Zenke; Yasuhide Den, all of Tokyo, Japan

[73] Assignee: NEC Corporation, Tokyo, Japan

[21] Appl. No.: 264,159

[22] Filed: Jun. 22, 1994

[30] Foreign Application Priority Data

Jun. 25, 1993 [JP] Japan .................. 5-154048

[51] Int. Cl.$^6$ .................. H01L 21/02
[52] U.S. Cl. .................. 437/235; 148/DIG. 25; 148/DIG. 118; 437/238
[58] Field of Search .................. 437/235, 236, 437/238; 148/DIG. 25, DIG. 118

[56] References Cited

U.S. PATENT DOCUMENTS

| | | | |
|---|---|---|---|
| 4,168,330 | 9/1979 | Kaganowicz | 437/235 |
| 5,262,358 | 11/1993 | Sigmund et al. | 437/235 |
| 5,290,736 | 3/1994 | Sato et al. | 437/238 |

FOREIGN PATENT DOCUMENTS 1-130535  5/1989  Japan .

OTHER PUBLICATIONS

M. Nakano et al. Extended Abst. 21st Conf Solid State Dev. and Materials Tokyo 1989 pp. 49–52.
S. Noguchi, et al., Liquid Phase Oxidation Employing O Atoms Produced by Microwave Discharge and Si(CH$_3$)4, Extended Abstracts of the 19th Conference on Solid State Devices and Materials, Tokyo, 1987, pp. 451–454.
Extended Abstracts (The 38th Spring Meeting, 1991); The Japan Society of Applied Physics and Related Societies, p. 633.
M. Hatanaka, et al., H$_2$O–Teos Plasma–CVD Realizing Dielectrics Having A Smooth Surface, Jun. 11–12, 1991 VMIC Conference, pp. 435–441.
M. Nakano, et al., Digital CVD of SiO$_2$, Extended Abstracts of the 21st Conference on Solid State Devices and Materials, Tokyo, 1989, pp. 49–52.

*Primary Examiner*—George Fourson
*Assistant Examiner*—C. Everhart
*Attorney, Agent, or Firm*—Popham, Haik, Schnobrich & Kaufman, Ltd.

[57] ABSTRACT

A method of fabricating a semiconductor device includes the steps of forming a wiring layer on the surface of a semiconductor substrate, depositing a silicone film on the whole surface of the semiconductor substrate including the wiring layer by a CVD method and exposing the silicone film to oxidative plasma with enhanced frequencies including components of 1 MHz or less to change to a silicon oxide film, the depositing step and exposing step being alternately repeated in the same apparatus till the silicon oxide film having any desired thickness is obtained. The resulting silicon oxide film has the smooth surface and the high density.

19 Claims, 7 Drawing Sheets

METHOD OF FABRICATING SEMICONDUCTOR DEVICES

BACKGROUND OF THE INVENTION

1. Field of the Invention

The present invention relates to a method of fabricating a semiconductor device and in particular to a method of forming a silicon oxide film which is used as an interlayer insulating or dielectric film between wiring layers in the semiconductor device.

2. Disclosure of the Related Art

Recently, in semiconductor devices, two or more of metal wiring layers have been used for the purpose of high integration and speeding up thereof. As for an interlayer insulating or dielectric film between these metal wiring layers, in general a silicon oxide film has been used. In association with the requirements for highly densified or fine wiring layers and high aspect ratio, the insulating film having a smooth or planarized surface has been required to facilitate a processing step of the metal wiring in the subsequent steps.

In the past, as for a method of forming the silicon oxide film having such smooth surface, there have been known some methods as mentioned below.

As a first prior art, there was known, for instance, a method of forming a silicon oxide film in which a silicone film comprising siloxane having silicon and organic groups is applied on a semiconductor substrate and is subjected to plasma oxidation to form the silicon oxide film as taught in Japanese Unexamined Patent Publication Hei 1-130535. Namely, in this first prior art, a coating solution for forming the silicone based film is spin-coated on the semiconductor substrate and is dried at a temperature below 150° C. to form the silicone based film. Successively, the semiconductor substrate is placed into an inductive coupling type plasma treating apparatus and is exposed to oxygen plasma to be oxidized by oxygen radicals, whereby the surface of the silicone based film is changed into a silicon oxide film.

As a second prior art, there was known a method of forming a silicon oxide film from tetramethylsilane and oxygen plasma as taught in S. Noguchi et al., Extended Abstracts of the 19th Conference on Solid State Devices and Materials, pp. 451–454 (1987). In the second prior art, a semiconductor substrate is placed in a reaction chamber, tetramethylsilane and afterglow of the oxygen plasma are introduced on the surface of the semiconductor substrate and subjected to reaction to thereby form a siloxane film having fluidity, typically a hexamethyldisiloxane film.

As a third prior art which is similar to the second prior art, there was known a method of forming a silicon oxide series film having fluidity by introducing silane and oxygen plasma onto the surface of a semiconductor substrate which was cooled to −110° C. as taught in Extended Abstracts (The 38th Spring Meeting, 1991; The Japan Society of Applied Physics and Related Societies, p. 633.

As a fourth prior art, there was known a method of forming a siloxane film which comprises synthesizing siloxane from a tetraethoxysilane and water vapor system according to plasma-enhanced chemical vapor deposition, transporting the siloxane to the surface of a semiconductor substrate and forming the siloxane film thereon, as taught in M. Hatanaka et. al., Jun. 11–12, 1991 VMIC Conference, pp. 435–441.

Furthermore, as a fifth prior art, there was known a method of forming a silicon oxide film which comprises the steps of introducing plasma-enhanced silane gas onto the surface of a semiconductor substrate to adsorb silane radical ($SiH_x$) to the semiconductor substrate surface and successively introducing plasma-enhanced oxygen gas onto the semiconductor substrate surface to oxidize the substrate surface with oxygen radical and form the silicon oxide film, one cycle consisting of the above two steps being repeated in the same apparatus to grow the silicon oxide film, as taught in M. Nakano et al., Extended Abstract of the 21st Conference on Solid State Devices and Materials, Tokyo, 1989, pp. 49–52.

In the case where the insulating films obtained by the above-mentioned prior arts are used as the interlayer insulating film between the metal wiring layers, various problems as mentioned below arise.

Application of the insulating film of the first prior art as the interlayer insulating film between the metal wiring layers will be explained with reference to FIGS. 1A to 1C.

Figure 1A:
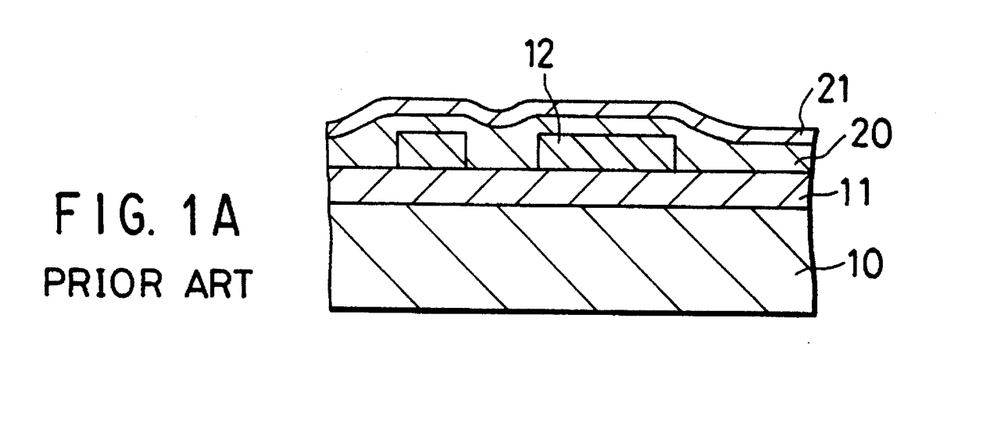
FIGS. 1A to 1C show a series of schematically and partially cross-sectional views of a semiconductor chip for explaining processes of an embodiment of a method of fabricating a semiconductor device according to the prior art.
Figure 1B:
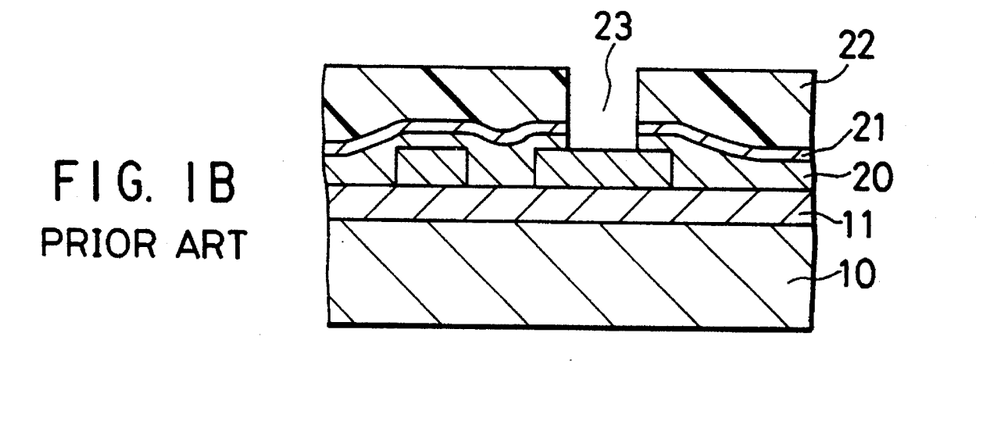
Figure 1C:
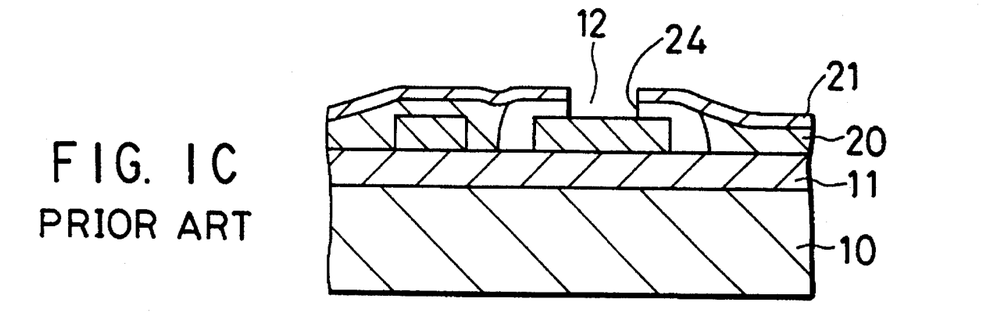

As shown in FIG. 1A, a metal wiring layer 12 comprising Al or the like is formed on the surface of a semiconductor substrate 10 made of Si or the like through a silicon oxide film 11. Then, a silicone film 20 is deposited on the metal wiring layer 12 including the silicon oxide film 11 and thereafter the surface of the film 20 is subjected to inductive coupling type plasma treatment to change the surface into a modified silicon oxide film 21. Then, as shown in FIG. 1B, contact holes 23 are made at the designated place by a dry etching process to reach the surface of the metal wiring layer 12, in which a photoresist film 22 having openings at the designated position is used as a mask in the etching process. Thereafter, as shown in FIG. 1C, the photoresist film 22 is removed by oxygen plasma treatment. In this case, the surface of the silicone film 20 defining side walls of the contact holes 23 is oxidized by oxygen plasma to change to a low density silicon oxide film 24. Since this low density silicon oxide film 24 is highly hygroscopic, the film 24 absorbs atmospheric moisture. Thus, when the upper metal wiring layer or layers are formed, problems exist in that the metal wiring of the upper layer is broken and contact resistance increases because of outgas of the absorbed moisture.

In the second prior art, since the reaction of tetramethylsilane with oxygen is performed at a low temperature of −40° C. to deposit the siloxane film, silicon oxide in the siloxane film is insufficiently bonded and thus the film becomes low density. If the siloxane film is used as the interlayer insulating film between the metal wiring layers, the siloxane film contracts during the subsequent heat treatment, for instance, at 400° C. and thus cracks. A problem exists in that the cracking gives rise to the breaking and a short circuit of the metal wiring when the wiring layer is formed on the siloxane film.

Also, in the third and fourth prior arts, since the film deposition is performed at a low temperature, a problem exists in that the film cracks in the same manner as in the second prior art.

Furthermore, in the fifth prior art, since the silane radical has no fluidity, it is impossible to obtain the smooth surface. Also, since the afterglow of oxygen plasma is used in the oxidation reaction, gas molecule has low ion energy and the resulting silicon oxide film is a low density film. As a result, the silicon oxide film cracks during the subsequent heat treatment for densifying the film in the same manner as in the second prior art.

SUMMARY OF THE INVENTION

Accordingly, an object of the present invention is to obviate defects of the prior arts as mentioned above and to form a silicon oxide film having a smooth surface and densified film quality.

The above object is accomplished by providing a method of fabricating a semiconductor device comprising the steps of forming a wiring layer on the surface of a semiconductor substrate, depositing a silicone compound film on the whole surface of the semiconductor substrate including the wiring layer by a CVD method and exposing the silicone compound film to oxidative plasma to form a silicon oxide film, the depositing step and the exposing step being repeated alternately in the same apparatus till a thickness of the silicon oxide film reaches any desired thickness.

In the above exposing step, enhanced frequencies of the oxidative plasma include components of 1 MHz or less.

In the above-mentioned depositing step, the silicone compound film is deposited in an atmosphere including at least one member selected from the group consisting of halogenated organic silane, halogenated organic siloxane and organic siloxane and water vapor, under reduced pressure; in a plasma atmosphere of gas containing organic siloxane and water vapor; or in a plasma atmosphere of gas containing organic siloxane and oxygen.

The halogenated organic silane includes, for instance, halogenated alkylsilane or phenylsilane such as dichlorodimethylsilane, dichlorodiethylsilane, dichlorodiphenylsilane or the like. Halogen may be at least one of chlorine, fluorine or the like, or a mixture thereof.

The halogenated organic siloxane includes, for instance, halogenated alkylsiloxane such as dichlorotetramethyldisiloxane or the like. Halogen may be at least one of chlorine, fluorine or the like, or a mixture thereof.

The organic siloxane includes, for instance, alkylsiloxane such as methylsiloxanes (e.g. octamethylcyclotetrasiloxane, hexamethylcyclotrisiloxane, decamethylcyclopentasiloxane, hexamethylsiloxane, octamethyltrisiloxane or the like) or ethylsiloxanes; phenylsiloxanes; or the like.

The final silicon oxide film has any desired thickness which is not particularly limited. In general, the term "any desired thickness" means a thickness enough to be used as an interlayer insulating film between wiring layers in the field of the semiconductor devices.

The foregoing and other objects and features of the present invention will be in more detail apparent from the following description.

DETAILED DESCRIPTION OF THE PREFERRED EMBODIMENTS

The present invention will be hereinafter described in more detail with reference to the accompanying drawings.

Figure 2:
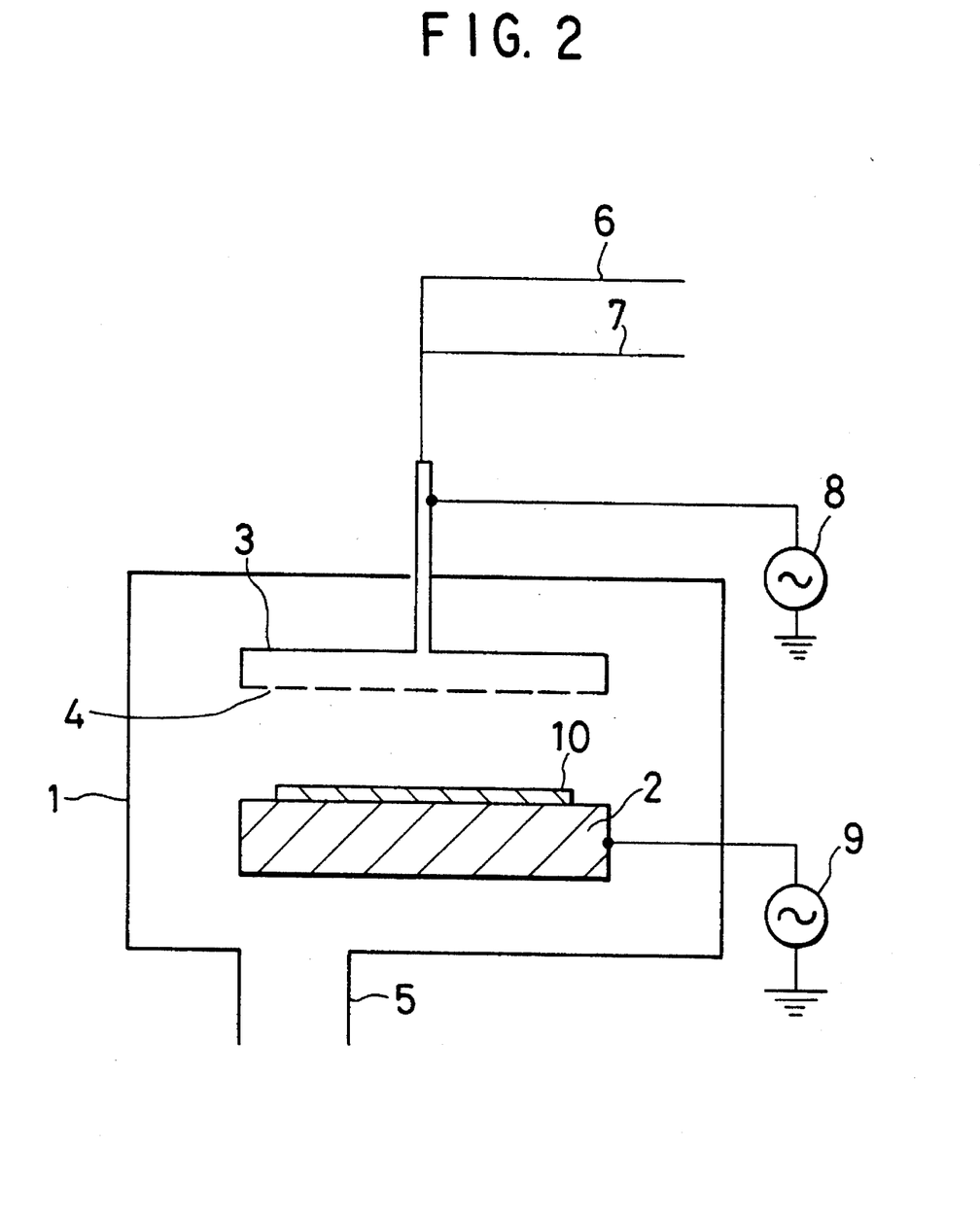
FIG. 2 shows a schematically longitudinal section of a main portion of an apparatus for carrying out a method of the present invention.

Referring to now FIG. 2, there is shown a schematically longitudinal section of a main portion of an apparatus for forming a silicon oxide film which is used in a method of fabricating a semiconductor device according to the present invention.

In the silicon oxide film-forming apparatus, a lower electrode 2 and an upper electrode 3 are disposed in a reaction chamber with an exhaust pipe 5 in such a way that they stand opposite each other, and a semiconductor substrate 10 is placed on the lower electrode 2 of which temperature is controlled. A gaseous organic material such as organic siloxane, halogenated organic siloxane, halogenated organic silane or the like and oxidative gas such as oxygen, water vapor or the like are introduced through pipes 6 and 7 respectively, from the upper electrode 3 with openings 4 into the reaction chamber 1 and are exhausted from the exhaust pipe 5. A high-frequency power source 8 and a low-frequency power source 9 are connected to the upper electrode 3 and the lower electrode 2, respectively.

Next, a first embodiment of the present invention will be explained with reference to FIGS. 3A to 3C, which show a series of partially and schematically cross-sectional views of a semiconductor chip for explaining processes of the first embodiment.

Figure 3A:
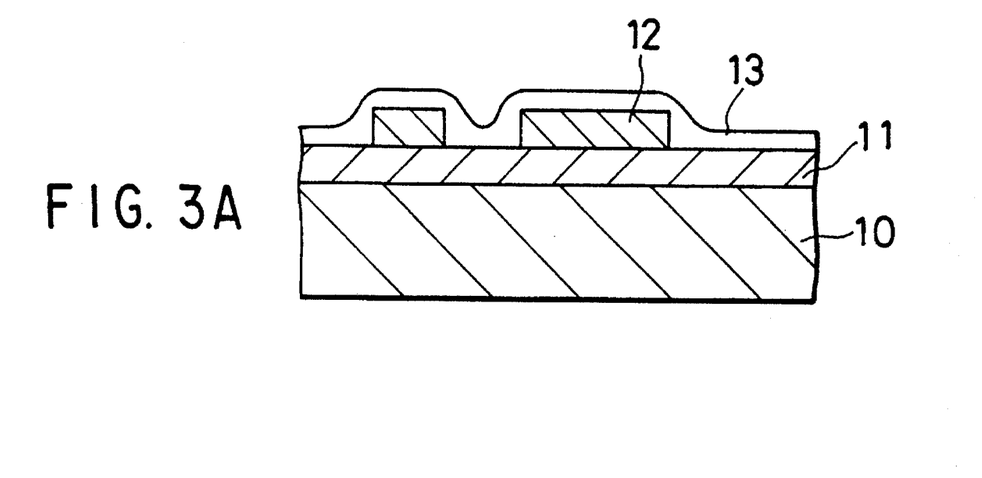
FIGS. 3A to 3C show a series of partially and schematically cross-sectional views of a semiconductor chip for explaining processes of a first embodiment of a method of fabricating a semiconductor device according to the present invention.

Referring to now FIG. 3A, a silicon oxide film 11 was deposited on the surface of a semiconductor substrate 10 and then a metal wiring layer 12 comprising Al or the like was formed on the silicon oxide film 11, according to a conventional process. Next, in depositing a silicon oxide film serving as an interlayer insulating film on the semiconductor substrate 10 with the silicon oxide film 11 and the metal wiring layer 12 thereon by a CVD method, the substrate 10 was placed on the lower electrode 2 disposed in the apparatus as shown in FIG. 2.

Then, 20 sccm of halogenated organic silane, for instance, dichlorodimethylsilane ($SiCl_2(CH_3)_2$) was introduced through the pipe 6 into the reaction chamber 1 and 50 sccm of water vapor was introduced through the pipe 7 therein. While keeping the pressure in the reaction chamber 1 at 10 Torr and the temperature of the lower electrode 2 at 50° C., a dimethylsiloxane film 13 was deposited on the semiconductor substrate 10 with the silicon oxide film 11 and the wiring layer 12. Since the dimethylsiloxane film has small surface tension of 20 dyn/cm, its surface is smooth as shown in FIG. 3A. After the dimethylsiloxane film 13 having a thickness of about 100 nm was deposited thereon, the pipe 6 was closed to discontinue the introduction of dichlorodimethylsilane and then electric power of 60 W was applied to the upper electrode 3 using the high-frequency power source 8 and electric power of 140 W was applied to the lower electrode 2 using the low-frequency power source 9. For instance, 13.56 MHz as the high frequency and 250 KHz as the low frequency were used for the application of electric power.

Figure 3B:
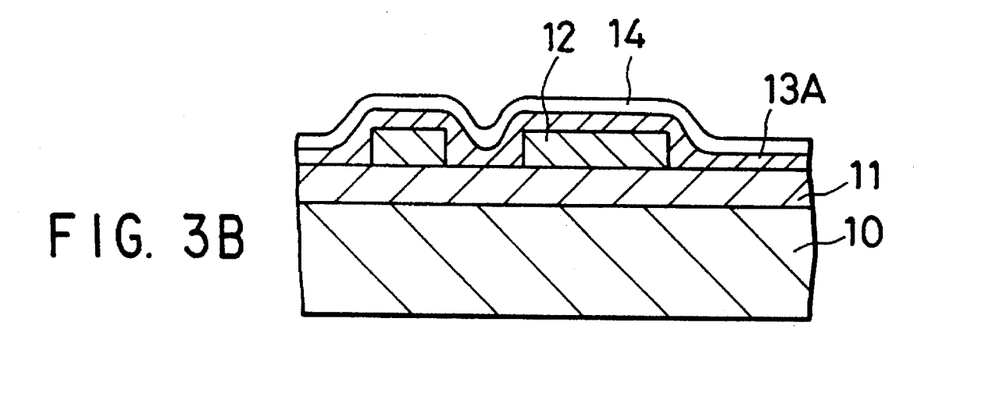

The dimethylsiloxane film 13 was oxidized by water vapor plasma thus generated to change in a silicon oxide film 13A as shown in FIG. 3B. The high frequency of 13.56 MHz was used in order to increase the density of oxygen radical and thus enhance oxidation property by generating the plasma under relative high pressure such as 10 Torr, whereas the low frequency of 250 KHz was used in order to enhance ion energy and densify the silicon oxide film 13A by ion bombardment thus caused as mentioned below. The dimethylsiloxane film 13 having a thickness of 100 nm was perfectly oxidized by the water vapor plasma to result in the densified silicon oxide film 13A. Then, the high-frequency power source 8 and the low-frequency power source 9 were interrupted and the pipe 6 was opened to reintroduce dichlorodimethylsilane into the reaction chamber 1. A dimethylsiloxane film 14 was deposited on the surface of the silicon oxide film 13A until a thickness of about 100 nm was reached. Successively, the dimethylsiloxane film 14 was exposed to the water vapor plasma to thereby form a densified silicon oxide film.

Figure 3C:
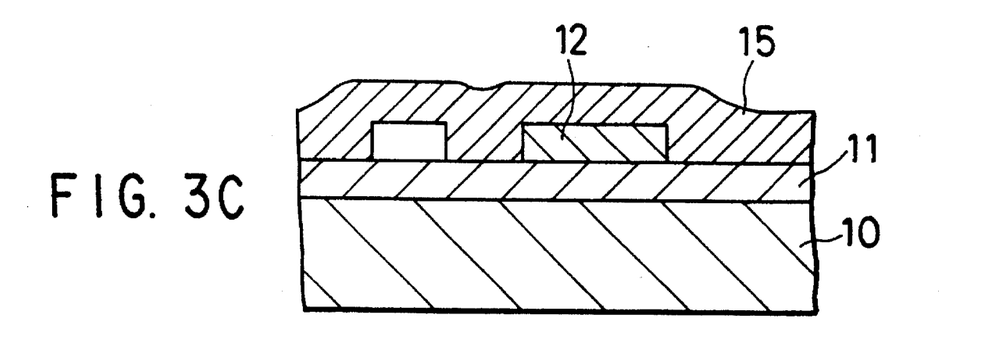
Figure 4:
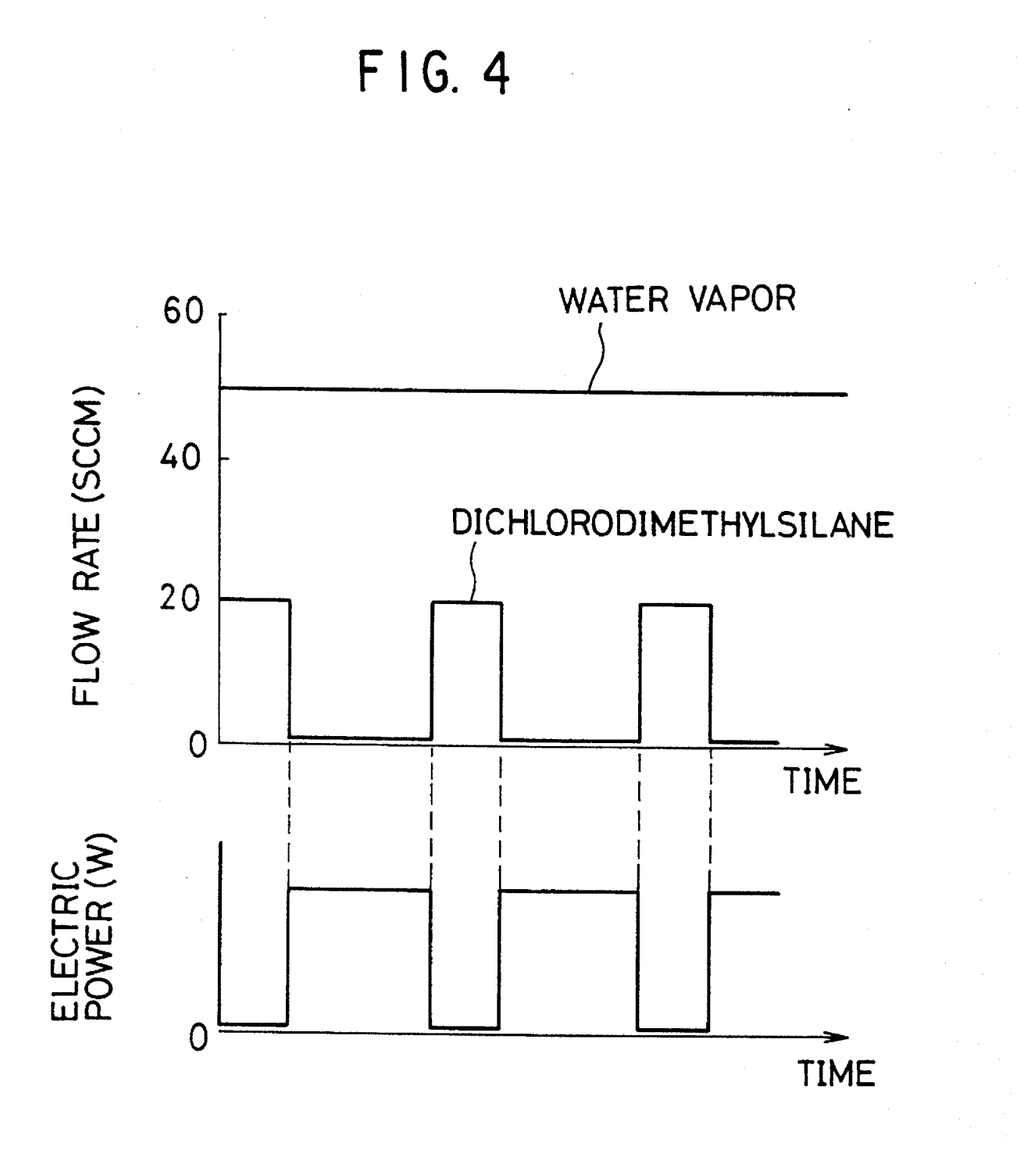
FIG. 4 is a diagram showing change of each parameter with time for explaining the first embodiment of the present invention.

Thereafter, the formation of dimethylsiloxane film and the oxidation thereof by the water vapor plasma were alternately repeated to obtain the densified silicon oxide film 15 having any prescribed thickness as shown in FIG. 3C. FIG. 4 shows change of each of the above parameters (water vapor, dichlorodimethylsilane, flow rate and electric power) in forming the silicon oxide film with time.

Figure 5:
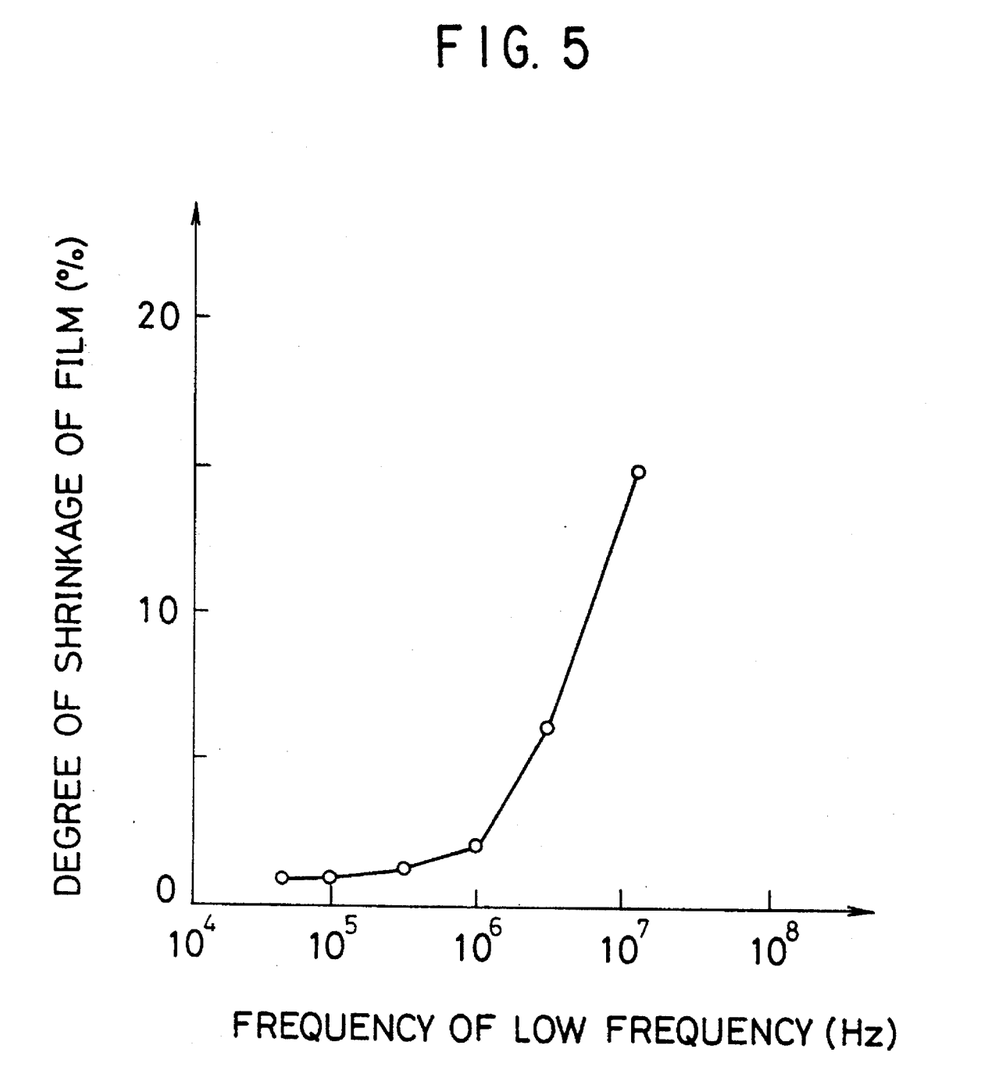
FIG. 5 is a graph showing the relation between the degree of shrinkage of a silicon oxide film and frequencies of low frequency.

FIG. 5 shows the degree of shrinkage of the silicon oxide film 15 which depends on change in the frequencies of the low-frequency power source 9 applied to the lower electrode 2, wherein the degree of film shrinkage (%) is plotted against the frequencies (Hz). The degree of film shrinkage means the difference between the original film thickness determined when the silicon oxide film 15 was formed and the film thickness determined after the silicon oxide film 15 was heat-treated at 900° C. for 30 minutes in an atmosphere of nitrogen, which was divided by the original film thickness. If the degree of shrinkage is beyond 2%, in general the silicon oxide film has enhanced hygroscopicity or moisture permeability. Thus, in the subsequent step of forming the upper metal wiring layer, the upper metal wiring was broken or short-circuited because of outgas of absorbed moisture. As a result, serious problems exist in production yield and reliability of semiconductor devices. As seen from FIG. 5, the densified silicon oxide film with the degree of film shrinkage being 2% or less can be obtained by selecting the frequencies of 1 MHz or less as the frequency of the power source applied to the lower electrode 2 to thus generate large ion energy.

In the above-mentioned first embodiment, the formation of the dimethylsiloxane film and the plasma oxidation of the film were alternately repeated each time the film having a thickness of 100 nm is formed. This is based on the fact that a thickness of film to be densified by ion bombardment is limited to a depth of about 100 nm below the surface of the film. For this reason, in the first prior art method of applying the silicone film to the substrate and oxidizing the film with the plasma, the film changes to the silicon oxide film merely in the vicinity of the surface thereof and thus problems as mentioned above were caused.

In comparison with the first prior art method of applying the silicone film and oxidizing the film with the plasma, the method of the first embodiment has the advantage of sharply shortened process time because the deposition of the silicone film having a thickness of 100 nm at a time and the oxidation of the film are performed in the same reaction chamber. In addition, in comparison with the fifth prior art in which the adsorption of silane radical and the oxidative plasma treatment are alternately repeated to thereby form the silicon oxide film, the method of this embodiment has the advantages of the smooth surface which is attained by using the silicone film and the densified silicon oxide film which is obtained by treating the silicone film with the oxidative plasma including the low-frequency component of 1 MHz or less.

In the first embodiment, dichlorodimethylsilane was used as the halogenated organic silane but the similar effect is attained also by using dichlorodiethylsilane, dichlorodiphenylsilane or the like. In addition, the similar effect is attained also by using a mixture of the halogenated organic silane and halogenated organic siloxane, for instance, a mixture of dichlorodimethylsilane and dichlorotetramethyldisiloxane.

Figure 6:
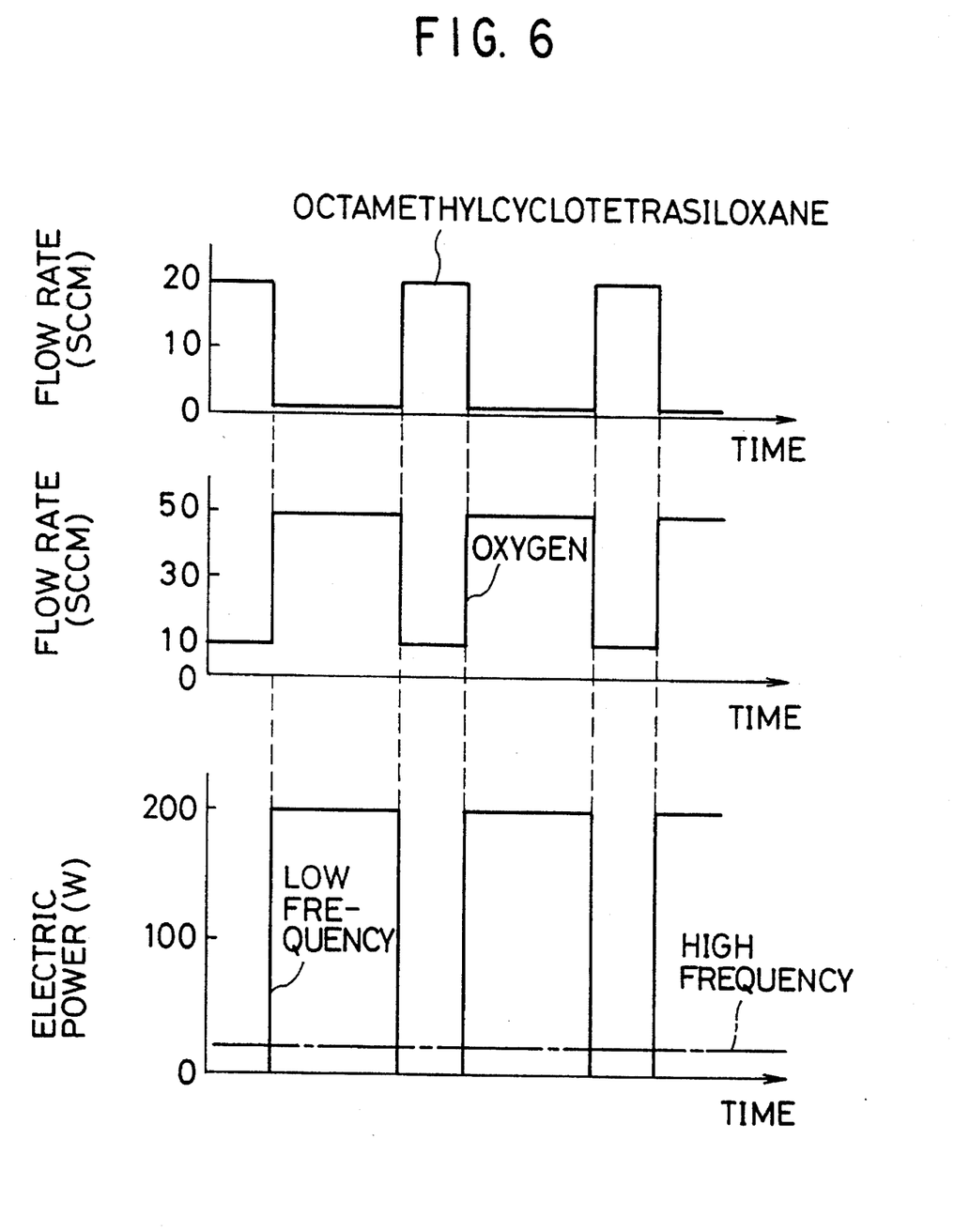
FIG. 6 is a diagram showing change of each parameter with time for explaining a second embodiment of the present invention.

Next, a second embodiment of the present invention will be described with reference to FIG. 6. The drawing shows change of each parameter (octamethylcyclotetrasiloxane, oxygen, flow rate, electric power) in forming a silicon oxide film with time, according to the present invention.

In contrast to the first embodiment in which the silicone film was deposited by the CVD method and particularly was formed by polymerization of the halogenated organic silane due to hydrolysis thereof, the second embodiment is based on plasma polymerization of organic siloxane and oxygen.

In the second embodiment, the apparatus as shown in FIG. 2 was used. Namely, after the semiconductor substrate 10 was disposed on the surface of the lower electrode 2, 20 sccm of the organic siloxane such as octamethylcyclotetrasiloxane, $[Si(CH_3)_2O]_4$, and 10 sccm of the oxygen were introduced through the pipes 6 and 7, respectively, into the reaction chamber 1 and at the same time, electric power of 20 W was applied to the upper electrode 3 from the high-frequency power source 8 of 13.56 MHz to generate plasma between the upper electrode 3 and the lower electrode 2. The pressure in the reaction chamber 1 was set at 10 Torr and the temperature of the lower electrode 2 was set at 200° C. Organic siloxanes having various molecular weight, for instance, polydimethylsiloxane or the like were formed in an atmosphere of this plasma and a silicone film was deposited on the semiconductor substrate 10.

After the silicone film, typically the polydimethylsiloxane film, having a thickness of about 100 nm was deposited on the substrate 10 as mentioned above, the pipe 6 was closed to discontinue the introduction of octamethylcyclotetrasiloxane, electric power of 200 W was applied to the lower electrode 2 from the low-frequency power source 9 of 250 KHz for 60 seconds while increasing the flow rate of oxygen to 50 sccm. As in detail mentioned in the first embodiment, the silicone film thus deposited changes to a densified silicon oxide film based on the plasma oxidation with ion bombardment due to the low frequency. Successively, the formation of silicone film and the plasma oxidation were alternately repeated, whereby the densified silicon oxide film having the smooth surface and any desired film thickness was formed in the same manner as in the first embodiment.

In the second embodiment, octamethylcyclotetrasiloxane was used as the organic siloxane but the similar effect can be attained also by using methylsiloxanes such as hexamethylcyclotrisiloxane, decamethylcyclopentasiloxane, hexamethylsiloxane, octamethyltrisiloxane and the like. In addition, ethylsiloxanes and phenylsiloxanes may be used to attain the similar effect. If the above-mentioned organic siloxane is mixed with the halogenated organic silane, typically dichlorodimethylsilane, it is possible to promote the polymerization and thus increase the film-forming rate of the silicone film.

Next, a third embodiment will be described as follows. In the third embodiment, the same procedures as in the second embodiment were repeated except that the oxygen was replaced with water vapor. In this embodiment, a source material for depositing the silicone film is the same material as used in the second embodiment. As a result, it was possible to further increase the film-forming rate of the silicone film and improve the productivity because of addition of accelerated decomposition reaction to the plasma polymerization.

Figure 7:
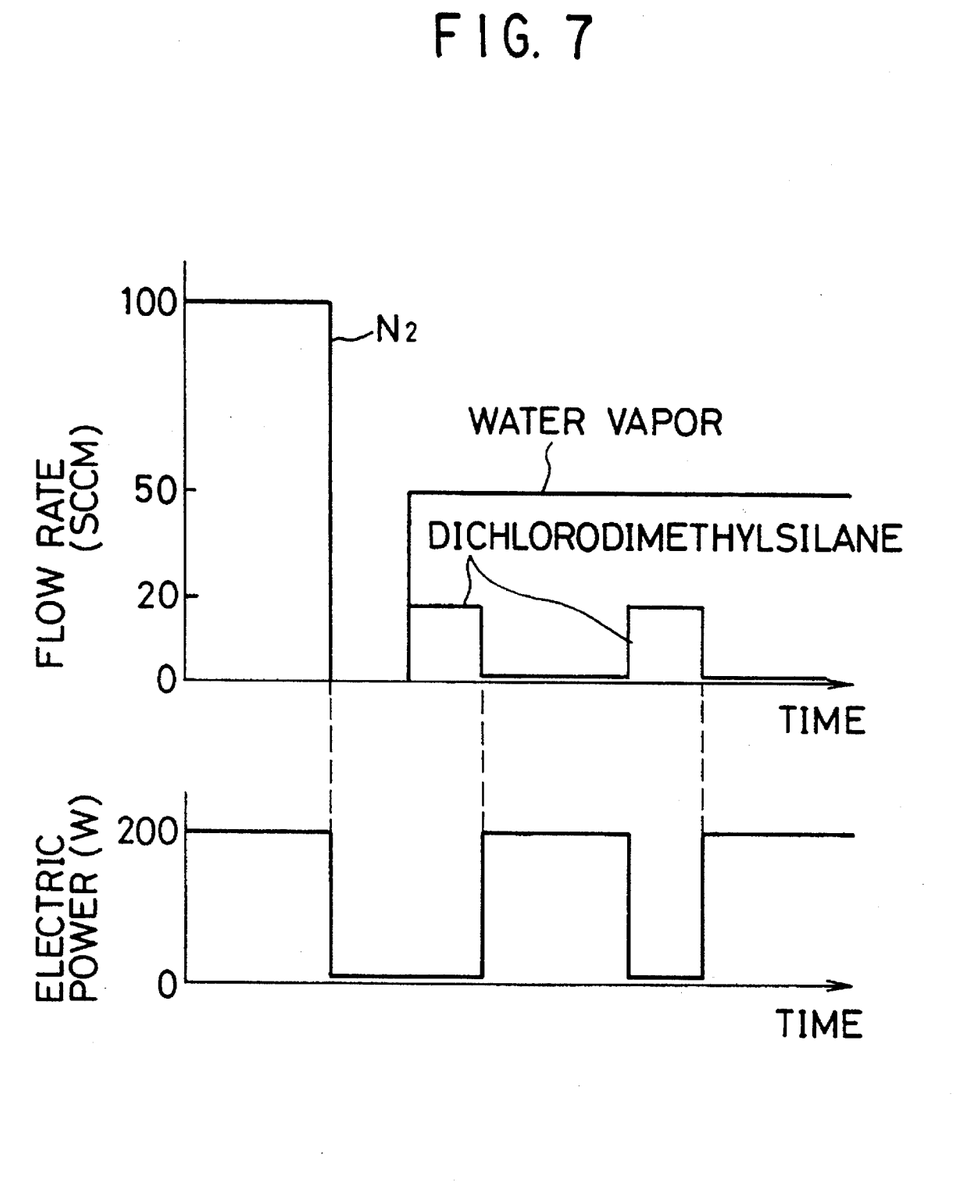
FIG. 7 is a diagram showing change of each parameter with time for explaining a fourth embodiment of the present invention.

Finally, a fourth embodiment will be described with reference to FIG. 7. In the fourth embodiment, the same procedures as in the first embodiment were repeated except that the semiconductor substrate 10 was exposed to plasma of nitrogen gas before depositing the silicone film thereon. FIG. 7 shows change of each parameter (dichlorodimethylsilane, water vapor, nitrogen gas, flow rate, electric power) in forming a silicon oxide film with time, according to the present invention.

Before depositing the silicone film on the semiconductor substrate 10 with the silicon oxide film 11 as shown in FIG. 3A, the substrate 10 was exposed to the flow rate 100 sccm of nitrogen and the electric power of 200 W for 10 seconds. As a result, the surface of the silicon oxide film 11 was nitrided and became hydrophobic. Thus, wettability of the silicone film (for instance, the dimethylsiloxane film 13 as shown in FIG. 3A) was improved and as a result, smoothness of the surface was further improved. In this case, the nitrogen gas may be replaced with nitrogen-containing gas such as ammonia gas or a mixture of nitrogen gas and ammonia gas.

As discussed above, according to the present invention, the step of depositing the silicone film on the surface of the semiconductor substrate on which the wiring layer is formed and the step of exposing the silicone film to the oxidative plasma are alternately repeated in the same apparatus to form the densified silicon oxide film having the smooth surface, the enhancement power source for the oxidative plasma including frequency components of 1 MHz or less. The resulting densified silicon oxide film does not crack in the course of the subsequent heat treatment step. Thus, even if the upper metal wiring layer is formed on the silicon oxide film, the contact resistance does not increase and the production yield and reliability of the semiconductor device are sharply improved.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A method of fabricating a semiconductor device comprising the steps of:

forming a wiring layer on a semiconductor substrate surface;

depositing a silicone compound film on the whole semiconductor substrate surface including said wiring layer by a CVD method; and exposing said silicone compound film to oxidative plasma to form a silicon oxide film, said depositing and exposing steps being alternately repeated in the same apparatus to form the silicon oxide film having any desired thickness;

wherein enhanced frequencies of said oxidative plasma include components of 1 MHz or less.

2. A method of fabricating a semiconductor device comprising the steps of:

forming a wiring layer on a semiconductor substrate surface;

depositing a silicone compound film on the whole semiconductor substrate surface including said wiring layer by a CVD method; and exposing said silicone compound film to oxidative plasma to form a silicon oxide film, said depositing and exposing steps being alternately repeated in the same apparatus to form the silicon oxide film having any desired thickness;

wherein said silicone compound film is deposited in an atmosphere including at least one source material selected from the group consisting of halogenated organic silane, halogenated organic siloxane and organic siloxane and water vapor, under reduced pressure.

3. A method of fabricating semiconductor device comprising the steps of:

forming a wiring layer on a semiconductor substrate surface;

depositing a silicone compound film on the whole semiconductor substrate surface including said wiring layer by a CVD method; and exposing said silicone compound film to oxidative plasma to form a silicon oxide film, said depositing and exposing steps being alternately repeated in the same apparatus to form the silicon oxide film having any desired thickness;

wherein said silicone compound film is deposited under a plasma atmosphere of gas including organic siloxane and water vapor.

4. A method of fabricating a semiconductor device comprising the steps of:

forming a wiring layer on a surface of a semiconductor substrate;

depositing a silicone compound film on the whole semiconductor substrate surface including said wiring layer by a CVD method; and exposing said silicone compound film to oxidative plasma to form a silicon oxide film, said depositing and exposing steps being alternately repeated in the same apparatus to form the silicon oxide film having any desired thickness;

wherein said silicone compound is deposited under a plasma atmosphere of gas including organic siloxane and oxygen.

5. A method of fabricating a semiconductor device comprising the steps of:

forming a wiring layer on a semiconductor substrate surface;

exposing said semiconductor substrate surface to a plasma atmosphere of nitrogen-containing gas in an apparatus;

depositing a silicone compound film on the whole semiconductor substrate surface including said wiring layer by a CVD method; and exposing said silicone compound film to oxidative plasma to form a silicon oxide film, said depositing and exposing steps being alternately repeating in said apparatus to form the silicon oxide film having any desired thickness.

6. The method of fabricating a semiconductor device as defined in claim 2, wherein said source material is said halogenated organic silane.

7. The method of fabricating a semiconductor device as defined in claim 6, wherein said halogenated organic silane is selected from the group consisting of dichlorodimethylsilane, dichlorodiethylsilane and dichlorodiphenylsilane.

8. The method of fabricating a semiconductor device as defined in claim 2, wherein said source material is a mixture of said halogenated organic siloxane and said halogenated organic silane.

9. The method of fabricating a semiconductor device as defined in claim 8, wherein said halogenated organic silane is selected from the group consisting of dichlorodimethylsilane, dichlorodiethylsilane and dichlorodiphenylsilane and said halogenated organic siloxane is dichlorotetramethyldisiloxane.

10. The method of fabricating a semiconductor device as defined in claim 3, wherein said organic siloxane is selected from the groups consisting of methylsiloxane, ethylsiloxane and phenylsiloxane.

11. The method of fabricating a semiconductor device as defined in claim 10, wherein said methylsiloxane is selected from the group consisting of octamethylcyclotetrasiloxane, hexamethylcyclotrisiloxane, decamethylcyclopentasiloxane, hexamethylsiloxane and octamethyltrisiloxane.

12. The method of fabricating a semiconductor device as defined in claim 3, wherein said gas includes further halogenated organic silane.

13. The method of fabricating a semiconductor device as defined in claim 12, wherein said halogenated organic silane is selected from the group consisting of dichlorodimethylsilane, dichlorodiethylsilane and dichlorodiphenylsilane.

14. The method of fabricating a semiconductor device as defined in claim 4, wherein said organic siloxane is selected from the group consisting of methylsiloxane, ethylsiloxane and phenylsiloxane.

15. The method of fabricating a semiconductor device as defined in claim 14, wherein said methylsiloxane is selected from the group consisting of octamethylcyclotetrasiloxane, hexamethylcyclotrisiloxane, decamethylcyclopentasiloxane, hexamethylsiloxane and octamethyltrisiloxane.

16. The method of fabricating a semiconductor device as defined in claim 4, wherein said gas includes further halogenated organic silane.

17. The method of fabricating a semiconductor device as defined in claim 16, wherein said halogenated organic silane is selected from the group consisting of dichlorodimethylsilane, dichlorodiethylsilane and dichlorodiphenylsilane.

18. A method of fabricating a semiconductor device comprising the steps of:

forming a wiring layer on a surface of a semiconductor substrate;

depositing a silicone compound film on a whole surface of said semiconductor substrate including said wiring layer by a CVD method, a source material for said silicone compound film being at least one member selected from the group consisting of halogenated alkylsilane, halogenated phenylsilane, halogenated alkylsiloxane, alkylsiloxane and phenylsiloxane; and exposing said silicone compound film to oxidative plasma with enhanced frequencies including components of 1 MHz or less to change to a silicon oxide film;

said depositing step and exposing step being alternately repeated in the same apparatus to form the silicon oxide film having any desired thickness.

19. A method of fabricating a semiconductor device comprising the steps of:

(a) forming a metal wiring layer on a surface of a semiconductor substrate through a silicon oxide film;

(b) placing the semiconductor substrate with said metal wiring layer on a lower electrode disposed in a reaction chamber;

(c) introducing at least one source material selected from the group consisting of halogenated alkylsilane, halogenated phenylsilane, halogenated alkylsiloxane, alkylsiloxane and phenylsiloxane and water vapor into said reaction chamber to deposit a silicone film on a whole surface of said semiconductor substrate including said metal wiring layer under reduced pressure, said semiconductor substrate may be exposed to nitrogen-containing gas in said reaction chamber before introducing said source material therein;

(d) discontinuing the introduction of said source material;

(e) applying electric power across said lower electrode and an upper electrode which are disposed in said reaction chamber so that said lower and upper electrodes are facing each other, to generate water vapor plasma with enhanced frequencies including components of 1 MHz or less;

(f) oxidizing said silicone film with said water vapor plasma to form a densified silicon oxide film; and then (g) repeating said steps (c) to (f) in the same reaction chamber to form the densified silicon oxide film having any desired thickness.

* * * * *